United States Patent [19]

Faultersack

[11] Patent Number: 4,510,553
[45] Date of Patent: Apr. 9, 1985

[54] ELECTROMECHANICAL ASSEMBLY FOR ALIGNING, DISCHARGING, AND SEQUENTIALLY ENGAGING CONDUCTORS OF A P.C. BOARD WITH A BACKPLANE

[75] Inventor: David D. Faultersack, Escondido, Calif.

[73] Assignee: Burroughs Corporation, Detroit, Mich.

[21] Appl. No.: 460,142

[22] Filed: Jan. 24, 1983

[51] Int. Cl.³ .............................................. H02H 7/20
[52] U.S. Cl. .................................. 361/413; 361/399; 361/412; 339/17 LC
[58] Field of Search ............... 361/331, 380, 394, 395, 361/396, 397, 412, 413, 420, 9, 339, 337, 404; 339/17 R, 17 C, 17 LC, 17 LM

[56] References Cited

U.S. PATENT DOCUMENTS

| | | | |
|---|---|---|---|
| 3,710,197 | 1/1973 | Olds et al. | 361/412 X |
| 3,891,898 | 6/1975 | Damon | 361/414 X |
| 4,079,440 | 3/1978 | Ohnuma et al. | 361/413 X |
| 4,179,172 | 12/1979 | Godsey et al. | 339/17 LM |
| 4,245,270 | 1/1981 | Busby | 361/9 X |
| 4,454,552 | 6/1984 | Barnes et al. | 361/412 X |

*Primary Examiner*—B. Dobeck
*Assistant Examiner*—Roger B. Carr
*Attorney, Agent, or Firm*—Charles J. Fassbender; Kevin R. Peterson

[57] ABSTRACT

An electromechanical assembly is comprised of: a printed circuit board, a backplane, first and second passages that extend completely through the backplane, ground and power conductors on the backplane that respectively border the passages, ground and power pins on the board that extend in a cantilevered fashion past the board by relatively long and relatively short distances for sliding through the passages in a sequential fashion while engaging the bordering ground and power conductors.

11 Claims, 9 Drawing Figures

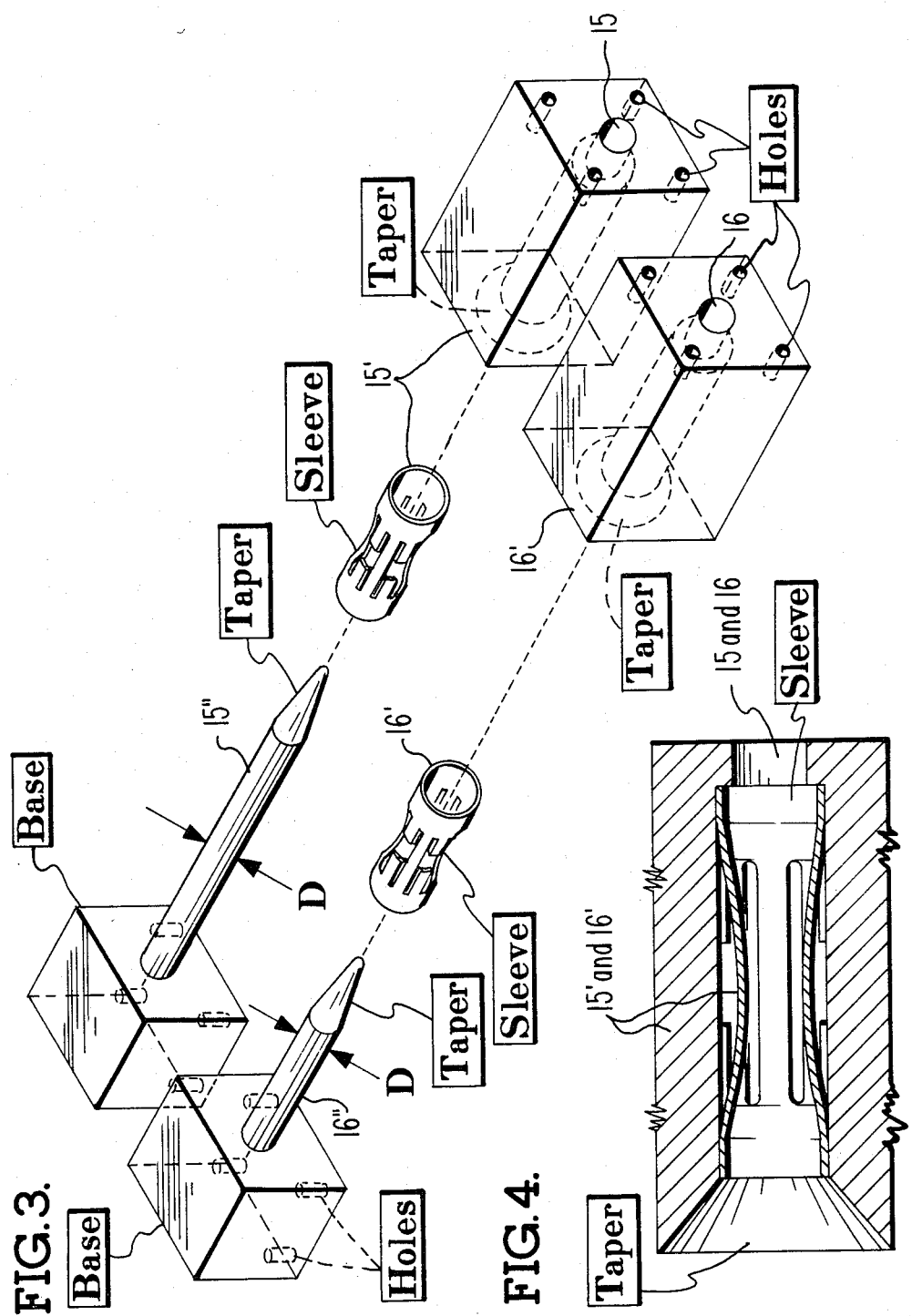

4,510,553

ELECTROMECHANICAL ASSEMBLY FOR ALIGNING, DISCHARGING, AND SEQUENTIALLY ENGAGING CONDUCTORS OF A P.C. BOARD WITH A BACKPLANE

BACKGROUND OF THE INVENTION

This invention relates to electromechanical assemblies; and in particular, it relates to assemblies of the type that include a plurality of printed circuit (P.C.) boards which are mechanically held in place by respective card guides in a frame and are electrically coupled together by conductors on a backplane.

One function of the card guides is to align the boards such that power conductors, ground conductors and signal conductors on the board align with corresponding conductors on the backplane. In operation, boards are inserted into the assembly by sliding them in the card guides toward the backplane until the corresponding conductors engage; and boards are removed from the assembly by sliding them in the card guides in an opposite direction.

However, the boards must fit loosely between the card guides so that they can move freely with little friction. But this, in turn, causes the conductors on the board to be in misalignment with the corresponding conductors on the backplane. Consequently, damage can occur to those conductors when the card is inserted into the assembly.

Also, static charge can accumulate on a board as it is handled prior to insertion into the assembly. Then, when the board is inserted, the static charge is transmitted along the conductors on the backplane to other boards in the assembly where it can destroy various components, such as an integrated circuit chip.

Further, when a component on one of the boards in the assembly becomes defective, it is desirable to be able to replace that board without having to power the assembly down and then power it back up. Typically, one or more memory boards are included in the assembly, and re-initializing data in that memory after powering on can take a long time. But replacing a board in a conventional assembly with power on generates spurious signals on the backplane conductors; and that can cause circuitry on the remaining boards of the assembly to malfunction.

Accordingly, a primary object of the invention is to provide an improved electromechanical assembly of printed circuit boards.

Still another, more specific, object of the invention is to provide an electromechanical assembly which accurately aligns conductors on a printed circuit board with corresponding conductors on a backplane, removes electrostatic charge from the board, and connects the corresponding conductors on the board and backplane in a fashion that enables the board to be inserted and removed with power on.

BRIEF SUMMARY OF THE INVENTION

These and other objects are accomplished in accordance with the invention by an electromechanical assembly of the type that includes: a backplane with a ground conductor, a power conductor, and a plurality of signal conductors; a printed circuit board which also has a ground conductor, a power conductor, and a plurality of signal conductors that correspond to and respectively engage the conductors on said backplane; wherein the backplane has first and second passages which extend completely through the backplane; the backplane ground and power conductors respectively border the first and second passages; the circuit board ground conductor and the circuit board power conductor include respective pins that extend in a cantilevered fashion past the circuit board and respectively slide through the first and second passages while simultaneously engaging the bordering conductor; the ground conductor pin extends past both the circuit board signal conductors and the power conductor pin to mechanically align and remove electrostatic charge from the circuit board before any of the corresponding power and signal conductors engage; and the power conductor pin extends past the circuit board signal conductors to energize the circuit board after said corresponding conductors engage but before any of the corresponding signal conductors engage.

BRIEF DESCRIPTION OF THE DRAWINGS

Various features and advantages of the invention are described in the Detailed Description in conjunction with the accompanying drawings wherein:

FIG. 3 is a pictorial view illustrating in greater detail the structure of a pin and socket in the assembly of FIG. 1;

FIG. 4 is a cross-sectional view of the socket of FIG. 3;

FIG. 5 illustrates a circuit that is on a board in the FIG. 1 assembly which operates in conjunction with the pin and socket of FIG. 3 to permit the board to be inserted and removed with power on.

DETAILED DESCRIPTION OF THE INVENTION

Figure 1:
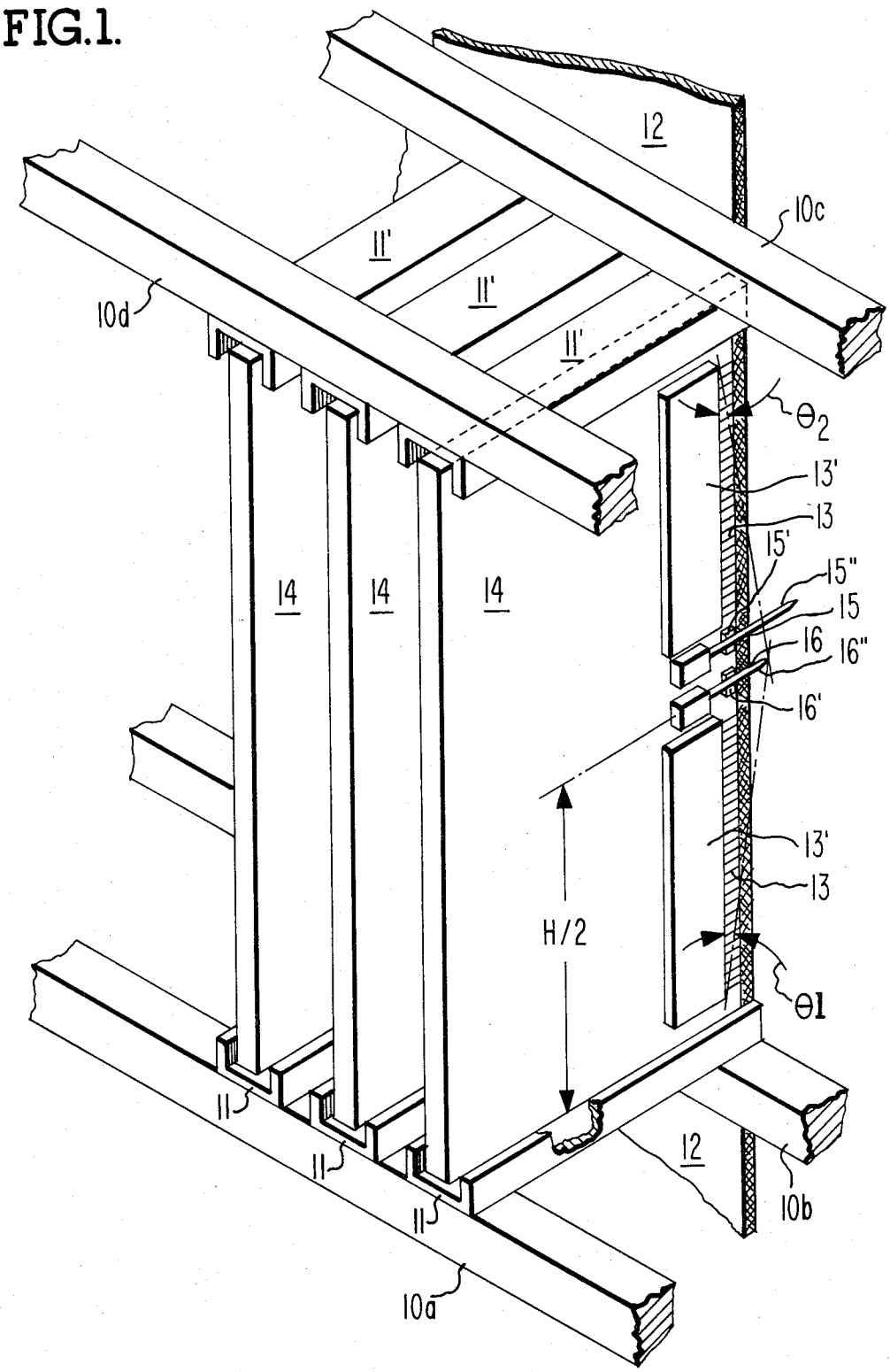
FIG. 1 is a pictorial view of an electromechanical assembly which is constructed according to the invention.

One preferred embodiment of the invention will now be described in conjunction with FIG. 1. That embodiment includes a frame having four spaced-apart parallel beams 10a, 10b, 10c, and 10d. Beams 10a and 10b lie in a horizontal plane; and beams 10c and 10d lie in another horizontal plane over beams 10a and 10b. A plurality of card guides 11 lie transverse to beams 10a and 10b; and a corresponding plurality of card guides 11' lie transverse to beams 10c and 10d.

A backplane 12, which is vertically oriented, attaches to beams 10b and 10c. Between each pair of corresponding card guides 11 and 11', backplane 12 contains a plurality of signal conductors 13. All of the signal conductors 13 for the various card guide pairs 11-11' are selectively connected together in a predetermined fashion by backplane wires (that are not shown).

Between each pair of card guides 11-11', a printed circuit board 14 may be inserted. Each of the boards 14 contains various circuitry, such as tens or hundreds of integrated circuit chips. Signal conductors 13', such as the 91 Series 0.100×0.100 grid conductors from Winchester Electronics Corporation, are mounted along an edge of each board 14; and they match and engage respective signal conductors 13 on backplane 12. Conductors 13 and 13' together with the backplane wiring provide a means for sending electrical signals from one board 14 to another.

Also, for each board 14, backplane 12 has a respective pair of passages 15 and 16 that extend completely through the backplane. Each passage 15 is bordered by a ground conductor 15'; and each passage 16 is bordered by a power conductor 16'. Preferably, conductors 15' and 16' are shaped either as tubular-shaped sockets with sidewalls that extend through the respective passages, or as ring-shaped sockets that surround the respective passages.

Each board 14 further includes a ground conductor 15" which is shaped as a cantilevered pin. Pin 15" extends off of board 14 by a relatively long distance past the signal conductors 13'; and its cross section is formed to slide through passage 15 while simultaneously engaging the bordering ground conductor 15'.

Similarly, each board 14 includes a power conductor 16" which is shaped as a cantilevered pin. Pin 16" extends off of board 14 past the signal conductors 13' by a distance which is less than the distance by which pin 15" extends from the board. Also, the cross section of pin 16" is formed to slide through passage 16 while simultaneously engaging the bordering power conductor 16'.

As board 14 is slid between a pair of card guides 11-11' towards backplane 12, the ground pin 15" slides into passage 15 and engages socket 15'. That movement mechanically aligns board 14 and removes electrostatic charge from the board before any of the other conductors 13 and 13' or 15 and 15' engage. Thereafter, the power pin 16" slides into passage 16 and engages socket 16'. That movement energizes board 14 before any of the corresponding signal conductors 13 and 13' engage.

Figure 2A:
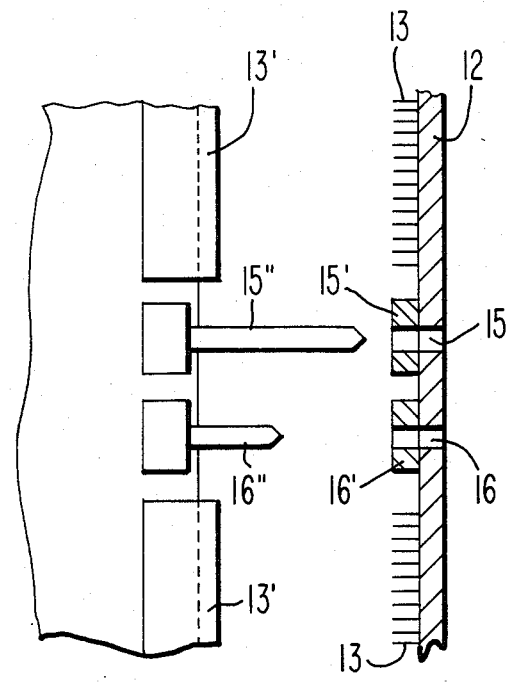
FIGS. 2A–2D illustrate the sequence by which corresponding ground conductors, power conductors, and signal conductors in the assembly of FIG. 1 engage.
Figure 2B:
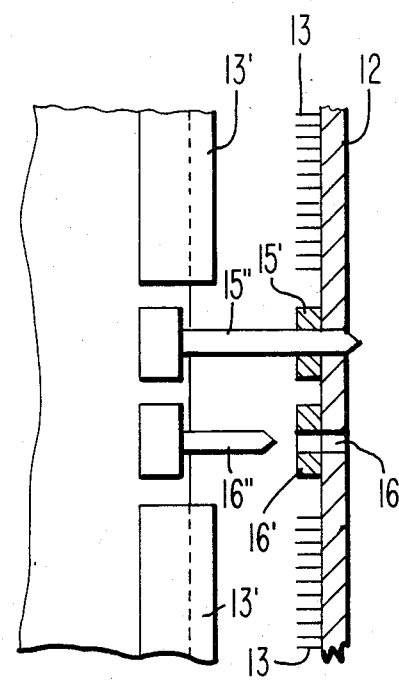

FIGS. 2A-2D illustrate components 15-15" and 16-16" in greater detail; and they also illustrate the sequential fashion by which those components engage. Referring first to FIG. 2A, it shows the relative positions of the components just before ground pin 15" engages socket 15'. Next, FIG. 2B shows the components just before power pin 16" has engaged socket 16'. In that stage, ground pin 15" has already penetrated backplane 12 through passage 15.

Figure 2C:
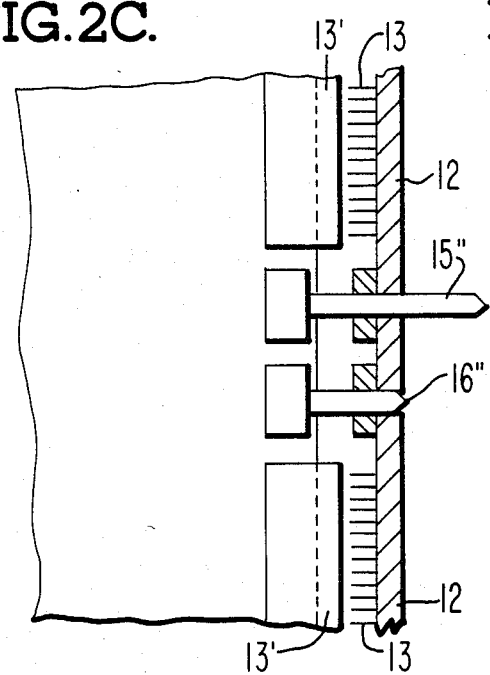
Figure 2D:
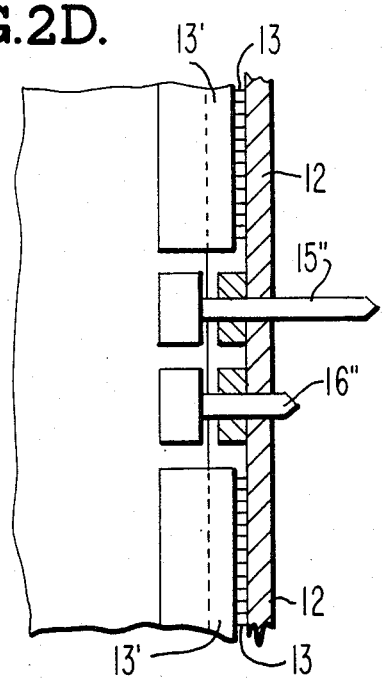

Next, FIG. 2C shows the components just before the corresponding signal conductors 13 and 13' engage. In that stage, pins 15" and 16" have both penetrated backplane 12. And FIG. 2D shows the final position of the above components. There, pins 15" and 16" have penetrated backplane 12 and the corresponding signal conductors 13 and 13' have engaged.

Preferably, as illustrated in FIGS. 1 and 2A-2D, ground pin 15" and power pin 16", are located spaced apart at the center of the board's edge. In that position, the misalignment angles $\theta_1$ and $\theta_2$ in FIG. 1 are equal to each other. Thus, for a given pin length, the angular misalignment that can be tolerated in either direction without destroying the sequence by which the corresponding conductors make contact will be maximized.

Some angular misalignment is caused by the fact that the card guides 11 and 11' must fit loosely around the edges of board 14. Otherwise, board 14 would not easily slide between the card guides without binding due to friction. Also, some angular misalignment is caused by various manufacturing tolerances in all of the components 10a-16".

To ensure that the power pin 16" contacts its socket 16' before any of the corresponding signal conductors engage, a condition must be met that can be written mathematically as: $\theta = \tan^{-1}(L \div H/2)$. In this expression, H is the height of board 14 and L is the length by which pin 16" extends past the signal conductors 13', and $\theta$ is the maximum angular misalignment between the board and the backplane. Then to ensure that ground pin 15" contacts its socket 15' first, pin 15" must extend past pin 16".

Suppose, for example, that the maximum allowable angular displacement for a 15 inch high board was determined to be 4.0°. Then to satisfy the above expression, L would have to be at least 0.53 inches; and pin 15" could be ⅛ inch longer. Such long pin lengths can easily be accommodated with the electromechanical assembly of FIG. 1 since several inches of room exist behind the backplane.

Also, the long pin lengths do not require additional space on the board. Thus they do not reduce the packaging density or interfere with components on the board. Further, since only one elongated ground pin 15" and one elongated power pin 16" are required along the board's edge to perform the above-described multiple functions, the number of signal conductors that can be placed along that edge is maximized.

Additional structural details of the pins 15" and 16" and their sockets 15' and 16' are illustrated in FIGS. 3 and 4. Pins 15" and 16" have a diameter D which is large enough to carry all of the current that the board requires without causing those pins to melt or become too hot. Preferably, diameter D is larger than the diameter of the signal conductors since they generally only carry low power signals. For example, pins 15" and 16" can have a diameter of 0.250 inches and carry 30 amps RMS of current; whereas the signal conductors can have a diameter of 0.025 inches and carry no more than one amp RMS of current.

Preferably, the ends of pins 15" and 16" which fit into the sockets are tapered. This helps to guide the pins into the sockets. Also preferably, the opposite ends of the pins are provided with a base that has small holes. This allows the base to be fastened to the printed circuit board by a pin that fits into those holes and into corresponding holes on board 14 by soldering or press fit.

Similarly, the ends of the passages in sockets 15' and 16' which receive pins preferably are tapered; and small holes are provided in the opposite ends of the sockets. This allows the socket to be fastened to the backplane by a pin that fits into those holes and into corresponding holes on the backplane 12 by soldering or press fit. Also, sockets 15' and 16' preferably include a tubular-shaped sleeve with sidewalls that respectively extend through the passage. Those sidewalls are bowed inward to act as a spring which compresses against the pin as it slides through the passage.

FIG. 3 shows the sleeve prior to its insertion into the passage; whereas FIG. 4 shows the sleeve after it is inserted into the passage and there deformed by a compression force to bow the sidewalls inward. Both the pin and the socket can consist of copper and are machined parts. By comparison, the sleeve is stamped from a sheet of phosphorous bronze and rolled into a tube as shown.

Figure 5:
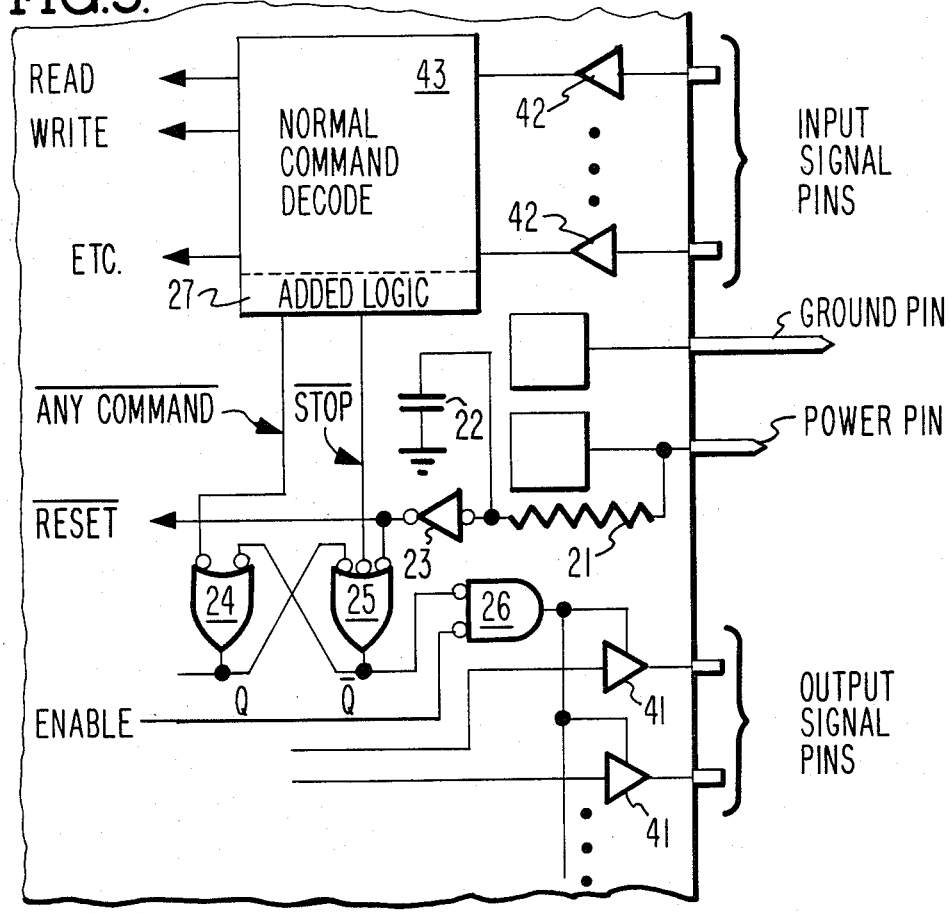
Figure 6:
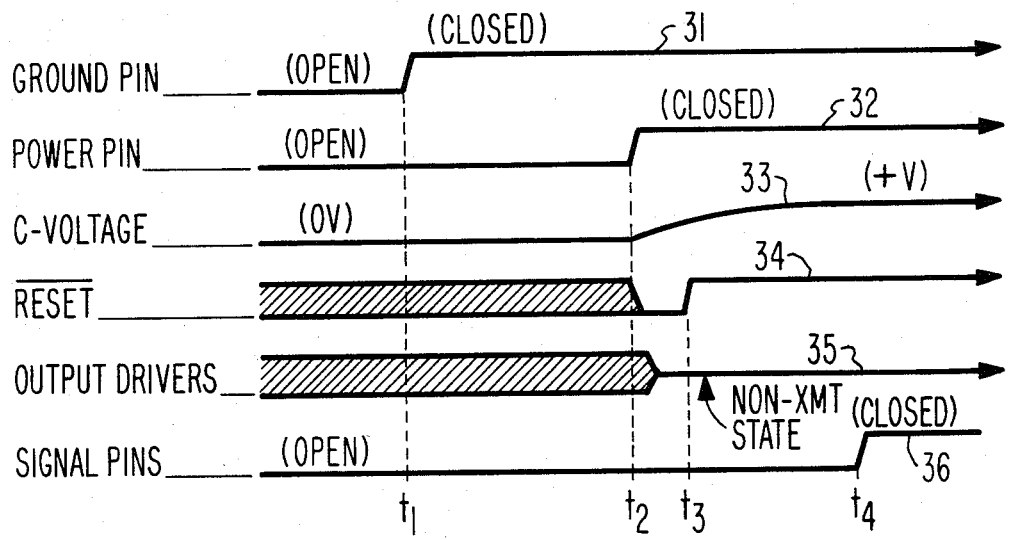
FIG. 6 is a timing diagram illustrating the operation of the FIG. 5 circuit.

Referring next to FIGS. 5 and 6, a circuit will be described which operates in conjunction with the above mechanisms to allow board 14 to be inserted into backplane 12 with power on without generating spurious signals on the backplane wires. This circuit includes a resistor 21, a capacitor 22, a buffer 23, a pair of NAND gates 24 and 25, a NOR gate 26, and a command decoder 27. Components 21–27 are interconnected as illustrated in FIG. 5; and they operate as illustrated in FIG. 6.

When board 14 is slid on a pair of card guides 11–11' towards backplane 12, the ground pin 15" is the first conductor on the board to engage its corresponding conductor in the backplane. This is indicated as occurring at time instant $t_1$ by curve 31 in FIG. 6. At that time, pin 15" and socket 15' mechanically align and remove any electrostatic charge from the circuit board.

Subsequently, as the board 14 is pushed further toward backplane 12, the power pin 16' engages socket 16'. This is indicated as occurring at time instant $t_2$ by curve 32 in FIG. 6. At that time, resistor 21 and capacitor 22 generate a slowly ramping voltage as is indicated by another curve 33.

Buffer 23 responds to the ramping voltage by generating a logic signal RESET which is high unless the ramping voltage is below a predetermined level. In FIG. 6, signal RESET is indicated by curve 34; and the predetermined voltage level is indicated as being reached at a time instant $t_3$.

Signal RESET is then sent to various conventional circuitry (not shown) on board 14 to force that circuitry into a predetermined initial state. Signal RESET is also sent to the cross-coupled NAND gates 24 and 25 to force the Q output of those gates into a high state. Output Q is then logically NOR'd with a conventional output driver ENABLE signal by gate 26; and the resulting NOR signal is sent to all three-state transmitters 41 on board 14 to force them into a non-transmit state. This is indicated by curve 35 in FIG. 6 as occurring between time instants $t_2$ and $t_3$.

Thereafter, as board 14 is pushed still further toward backplane 12, the corresponding signal conductors 13 and 13' engage. This is indicated by curve 36 in FIG. 6 as occurring at a time instant $t_4$. By that time, all of the circuitry on board 14 has been forced to a predetermined intial state and all of the output drivers on board 14 have been forced into a non-transmit state. Consequently, no spurious signals are sent from board 14 through the backplane wiring to other boards when conductors 13 and 13' engage.

After conductors 13 and 13' engage, signals can be received by board 14 via a plurality of input gates 42 in a conventional fashion. Those received signals are then decoded, also in a conventional fashion, by a circuit 43 to determine the various operations that the circuitry on board 14 is to perform. For example, if board 14 is a memory board, the input signals would be decoded by circuit 43 as a read data command or a write data command.

Included in the added logic 27 is an OR gate which generates an output signal ANY COMMAND that is low whenever the command decode circuit 43 detects the receipt of a command. Signal ANY COMMAND then forces the Q output of NAND gates 24 and 25 to a high, which in turn allows the transmitter ENABLE signal to pass through NOR gate 26 and permit the output drivers 41 to transmit.

Also included in the added logic 27 is a decoder which detects a combination of input signals that is interpreted as a STOP command. That STOP command is sent to board 14 whenever a malfunction is detected there by various means, such as by the running of a diagnostic program.

Upon detecting the STOP command, circuit 27 generates a logic signal STOP which is low and forces the Q output of NAND gates 24 and 25 high. That high blocks the normal transmit ENABLE signal which forces the output transmitters 41 into a non-transmit state. Thereafter, the defective board 14 can be removed from the assembly of FIG. 1 while power is on without generating spurious signals on the backplane conductors.

During such removal, the signal sequence for curves 31, 32, 35, and 36 are the same as illustrated in FIG. 6 with the exception that time on the horizontal axis increases from right to left. And, at time instant $t_4$, curves 32 and 36 show that when the signal conductors disengage, power is still being applied to the board. Thus, at that time, the Q output of gates 24 and 25 will remain high; and the transmitters 41 will remain in a non-transmit state until after all of the signal conductors disengage.

Various preferred embodiments of my invention have now been described in detail. In addition, however, many changes and modifications can be made to these details without departing from the nature and spirit of the invention. Accordingly, the invention is not to be limited to said details but is defined by the appended claims.

What is claimed is:

1. An electromechanical assembly of the type that includes:

a backplane with a ground conductor, a power conductor, and a plurality of signal conductors; a printed circuit board which also has a ground conductor, a power conductor, and a plurality of signal conductors that correspond to and respectively engage said conductors on said backplane; wherein said backplane has first and second passages which extend completely through said backplane;

said backplane ground and power conductors respectively border said first and second passages;

said circuit board ground conductor and said circuit board power conductor include respective pins that extend in a cantilevered fashion past said circuit board and respectively slide through said first and second passages while simultaneously engaging said bordering conductor;

said ground conductor pin extends past both said circuit board signal conductors and said power conductor pin to mechanically align and remove electrostatic charge from said circuit board before any of said corresponding power and signal conductors engage;

said power conductor pin extends past said circuit board signal conductors to energize said circuit board after said corresponding ground conductors engage but before any of said corresponding signal conductors engage; and said circuit board further includes a circuit means on said board for generating a reset pulse signal when said power pin begins to slide through said second passage.

2. An assembly according to claim 1 and further including a plurality of three-state transmitters on said board having output terminals connected to the signal conductors on said board, and another circuit means on said board responsive to said pulse for forcing said transmitters into a non-transmit state before the corresponding signal conductors on said circuit board and said backplane engage.

3. An assembly according to claim 1 wherein said backplane ground and power conductors include respective tubular-shaped sockets with sidewalls that respectively extend through said first and second passages.

4. An assembly according to claim 4 wherein said sidewalls of said sockets include a spring which compresses against the pin that slides through the passage.

5. An assembly according to claim 1 wherein said backplane ground and power conductors include respective ring-shaped sockets that respectively surround said first and second passages.

6. An assembly according to claim 1 wherein the distance by which said power conductor pin extends past said circuit board signal conductors is at least $(H/2)\tan\theta$ where H is the height of said board and $\theta$ is the maximum angular misalignment of said board with respect to said backplane.

7. An assembly according to claim 6 wherein said ground conductor pin extends past said power conductor pin by at least 0.5 inches.

8. An assembly according to claim 1 wherein the end of said ground pin that slides into said first passage is tapered.

9. An assembly according to claim 1 wherein the end of said first passage that said ground pin slides into is tapered.

10. An electromechanical assembly comprised of: a printed circuit board and a backplane, said backplane having first and second passages that extend completely through said backplane, ground and power conductors on said backplane that respectively border said passages, said board having only a single ground pin and a single power pin, said single ground and power pins extending in a cantilevered fashion past said board by relatively long and relatively short distances for sliding through said passages in a sequential fashion such that said circuit board receives a ground signal from said ground conductor before receiving any power signal from said power conductor.

11. An electromechanical assembly of the type that includes: a backplane with a ground conductor, a power conductor, and a plurality of signal conductors; a printed circuit board which also has a ground conductor, a power conductor, and a plurality of signal conductors that correspond to and respectively engage said conductors on said backplane; wherein said backplane has first and second passages which extend completely through said backplane;

said backplane ground and power conductors respectively border said first and second passages;

said circuit board ground conductor and said circuit board power conductor include respective pins that are located spaced apart at the center of an edge of said board and extend in a cantilevered fashion past said circuit board and respectively slide through said first and second passages while simultaneously engaging said bordering conductor;

said ground conductor pin extends past both said circuit board signal conductors and said power conductor pin to mechanically align and remove electrostatic charge from said circuit board before any of said corresponding power and signal conductors engage; and said power conductor pin extends past said circuit board signal conductors to energize said circuit board after said corresponding ground conductors engage but before any of said corresponding signal conductors engage.

* * * * *